(12) United States Patent
Uittenbogaard

(10) Patent No.: US 7,268,606 B2
(45) Date of Patent: Sep. 11, 2007

(54) HIGH-FREQUENCY SIGNAL SWITCHING

(75) Inventor: Teunis Hemanus Uittenbogaard, Nijmegen (NL)

(73) Assignee: NXP B.V., Eindhoven (NL)

( * ) Notice: Subject to any disclaimer, the term of this patent is extended or adjusted under 35 U.S.C. 154(b) by 5 days.

(21) Appl. No.: 10/505,269

(22) PCT Filed: Jan. 21, 2003

(86) PCT No.: PCT/IB03/00172

§ 371 (c)(1),
(2), (4) Date: Aug. 20, 2004

(87) PCT Pub. No.: WO03/071680

PCT Pub. Date: Aug. 28, 2003

(65) Prior Publication Data

US 2005/0118961 A1  Jun. 2, 2005

(30) Foreign Application Priority Data

Feb. 25, 2002  (EP) .................................. 02075739

(51) Int. Cl.
*H03L 5/00* (2006.01)
(52) U.S. Cl. ...................... 327/308; 327/376; 327/377; 327/365; 327/493; 333/101; 333/102; 333/103; 333/117
(58) Field of Classification Search ................. 327/308
See application file for complete search history.

(56) References Cited

U.S. PATENT DOCUMENTS

| 4,595,847 | A | * | 6/1986 | Weir ........................... 327/382 |
| 4,808,859 | A | * | 2/1989 | Even-or et al. .............. 327/432 |
| 5,448,207 | A | * | 9/1995 | Kohama ..................... 333/81 R |
| 5,777,530 | A | * | 7/1998 | Nakatuka ..................... 333/104 |
| 5,796,286 | A | * | 8/1998 | Otaka .......................... 327/308 |
| 5,825,227 | A | * | 10/1998 | Kohama et al. ............. 327/308 |
| 5,903,178 | A | * | 5/1999 | Miyatsuji et al. ........... 327/308 |
| 5,969,560 | A | * | 10/1999 | Kohama et al. ............. 327/308 |
| 6,281,762 | B1 | * | 8/2001 | Nakao et al. ................ 333/103 |
| 6,489,856 | B1 | * | 12/2002 | Weigand ..................... 333/81 R |
| 6,680,640 | B1 | * | 1/2004 | Behzad ........................ 327/308 |
| 6,836,159 | B2 | * | 12/2004 | Wodnicki .................... 327/100 |
| 6,956,426 | B2 | * | 10/2005 | Wodnicki .................... 327/382 |

FOREIGN PATENT DOCUMENTS

JP      63-093217   4/1988
WO    WO9955085   10/1999

\* cited by examiner

*Primary Examiner*—Tuan T. Lam
*Assistant Examiner*—Hiep Nguyen

(57) ABSTRACT

An electronic signal processing apparatus has a signal switch with a first and a second transistor of normally-on type, having main current channels coupled between an internal node and a switch input and output, respectively. A diode provides a switchable signal coupling between the internal node and ground. A switch control circuit has a control output that is DC coupled to the main current channel of the first and the second transistor via the internal node to control conduction of the main current channels. The diode is also DC-coupled to the internal node so that a DC potential of a terminal of the diode that controls whether the diode is on or off is determined by a potential of the internal node. The diode is preferably incorporated in the DC current path from the control output to the internal node, so that the diode is forward-biased when a control voltage that makes the main current channels non-conductive is applied.

4 Claims, 1 Drawing Sheet

HIGH-FREQUENCY SIGNAL SWITCHING

Figure 1:
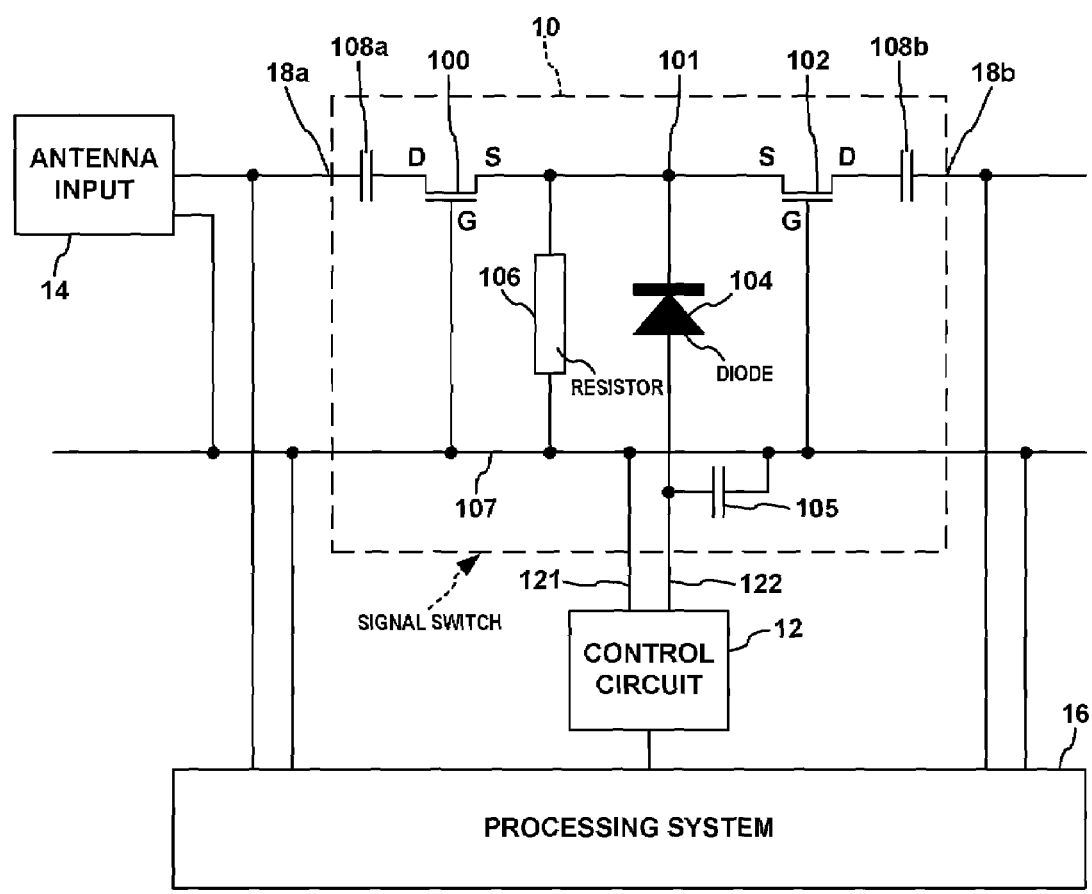

The invention relates to a high-frequency signal processing apparatus, such as a reception apparatus, and circuits used in connection with such an apparatus.

Typical examples of high-frequency reception apparatuses are video recorders and mobile telephones. Such apparatuses have RF switches that must operate reliably, using a simple design and a small amount of power. A video recorder, for example, must be able to provide a passive RF coupling from its antenna input to its TV set output when the video recorder is switched off, and to switch off said coupling when the video recorder is switched on.

PCT patent application WO99/55085, for example, discloses a video recorder with an RF switch that is provided with a first capacitor, a main current channel of a field effect transistor and a second capacitor coupled successively between the input and output. The gate of the field effect transistor is grounded. To control the switch, a resistor is provided between a control input and an internal node between the first capacitor and the main current channel of the transistor. By varying the voltage at the control input, the main current channel of the transistor can be made conductive or non-conductive, dependent on whether the RF switch should be turned on or off. Preferably, a normally-on transistor is used (which is conductive when no voltage difference is present between gate and source). Thus, a switch is realized that requires no power supply to pass the RF signal, using a very simple circuit.

Unfortunately, it has been found that such a switch does not provide enough isolation when the switch is off. A T-type circuit which improves the isolation is known from Japanese Patent Abstract publication No. 63-93217. Instead of a single main current channel between the switch input and the switch output, a series connection of the main current channels of a first and a second transistor is used, forming the horizontal branches of the "T". An internal node between the two main current channels is coupled to ground via the main current channel of a third transistor to form the leg of the "T". When the switch is on, the main current channels of the first and the second transistor are made conductive and the main current channel of the third transistor is made non-conductive. When the switch is off, the main current channels of the first and the second transistor are made non-conductive and the main current channel of the third transistor is made conductive. Thus, a better isolation is realized when the switch is off.

However, this is at the expense of a more complicated control circuit, because the third transistor has to be operated in phase opposition to the first and the second transistor. This does not even allow the switch to switch off completely when the supply voltage is off.

It is, inter alia, an object of the invention to provide an apparatus having a signal switch which can be controlled with a less complicated circuit that passes signals when no power is supplied to the switch.

It is a further object of the invention to provide an apparatus having a signal switch that needs a minimal number of components to control the switch and yet provides a good on/off transmission ratio.

The invention provides an apparatus as set forth in claim 1. By using a T-type attenuator structure, wherein the T-type attenuator structure includes a diode 104 in the leg of the T and "normally-on" transistors (100,102) in the branches of the T, a switch 10 is realized that is "on" when no power supply voltage is applied. Moreover, this circuit makes it possible to use an internal node 101 to apply a control voltage to both the transistors (100,102) and the diode 104, wherein the control voltage switches the switch 10 "off", as discussed further herein. In addition, with the embodiments of the present disclosure, no separate connections and no capacitors are needed to isolate the control voltage of the transistors and the diode from one another.

In a further embodiment, the control voltage is applied to the internal node 101 via the diode 104. Thus it is possible to generate a large voltage difference between the control electrode (i.e., corresponding to the gate G of each respective transistor 100 and 102) and the channel of the transistors, ensuring a high ratio between the impedance of the transistors in the on and off-states. As a result, the circuit is robust against spread in threshold values of the transistors and subthreshold leakage.

These and other objects and advantageous aspects of the apparatus and the switch according to the invention will be described in more detail, using the following FIGURE.

FIG. 1 shows an apparatus with a signal switch.

FIG. 1 shows an apparatus with a signal switch 10, a control circuit 12, an antenna input 14 and a processing system 16. The signal switch 10 is connected between the antenna input 14 (at input 18a) and an output 18b of the apparatus. The processing system 16 is also connected to the antenna input 14 (at input 18a) and the output 18b of the apparatus. In addition, control circuit 12 is coupled to the signal switch 10. Control circuit 12 is also coupled to the processing system 16, wherein the control circuit 12 is controlled from the processing system 16.

The signal switch 10 contains a first field effect transistor 100, a second field effect transistor 102, a diode 104, a decoupling capacitor 105, a resistor 106 and a pair of capacitors (108a and 108b). The gate, source, and drain of each transistor 100 and 102 are indicated in FIG. 1 by G, S, and D, respectively. The first and second transistors are of the "normally-on" type (depletion transistors), that is, they have a negative threshold voltage so that the main current channel conducts when the potential difference between the control electrode (gate G of the transistor) and the main current channel is zero. The main current channel becomes isolating (substantially without induced mobile charge carriers) only when the potential of the control electrode (gate G of the transistor) is at a potential more than a threshold below the potential of the main current channel. For example, transistors with a threshold of −3.5 Volts may be used (that is, a relatively large threshold voltage, so that the transistor is solidly on, with a low channel resistance, when the gate-source voltage is zero (i.e., $V_{GS}$=0 volts). Such a high threshold voltage is possible because the diode 104 is not connected in parallel with the gate-source of the transistors, as far as DC voltages are concerned). The diode 104 is preferably a silicon "PIN" diode, which has a low junction capacitance when it is reverse-biased. (PIN refers to the doping profile, which has a substantially undoped intrinsic region between the anode and the cathode of the diode.)

A signal input 18a of the switch 10 is coupled to a signal output 18b (which forms the output 18b) via, successively, a first one 108a of the capacitors, the main current channel of the first field effect transistor 100, an internal node 101, the main current channel of the second transistor 102 and a second one of the capacitors 108b. The control electrodes of the first and the second field effect transistor 100, 102 are coupled to a common conductor 107. The resistor 106 is coupled between the internal node 101 and this common conductor 107. A first output 121 of the control circuit 12 is coupled to the common conductor 107 and a second output 122 of the control circuit 12 is coupled to the internal node 101, the latter output 122 being coupled to the internal node 101 via diode 104 in the forward direction. The second output 112 of the control circuit 12 is also coupled to the common conductor 107 via decoupling capacitor 105.

In operation, an RF signal is received by antenna input 14. When processing system 16 is active, processing system 16 processes the RF signal and produces an output signal that is applied to output 18b. In this case, processing system 16 controls control circuit 12 to make signal switch 10 block the RF signal. That is, processing system 16 controls control circuit 12 in a manner wherein signal switch 10 is turned "off" and thereby does not allow the RF signal to pass through signal switch 10 from input 18a to output 18b. Control circuit 12 realizes this by applying a positive voltage of, for example, 5 Volts to the anode of diode 104, relative to common conductor 107, and thus forward-biasing the diode 104. This forward-biasing of diode 104 results in application of a positive voltage to internal node 101 relative to the common conductor 107. This positive voltage is equal to the voltage at the anode of the diode 104 minus a voltage drop across the diode 104, which is approximately 0.7 Volts in the case of a silicon diode, so that the voltage difference between the internal node 101 and the common conductor 107 is, for example, 4.3 Volts. Thus, the voltage of the control electrodes (i.e., the voltage applied to the respective gates G) of the first and second transistors 100, 102 is substantially below that of the main current channels of the first and second transistors 100, 102, thereby causing conduction through the main current channels of these transistors to be cut off. At the same time, the diode 104 is forward-biased, causing the diode 104 to have a low dynamic resistance, which is coupled to the common conductor 107 via decoupling capacitor 105. As a result, an "off" state of the signal switch 10 is realized in which the main current channels of transistors 100, 102 and diode 104 form a T-type attenuator between input 18a and output 18b with a large attenuation factor.

When processing system 16 is not active, control circuit 12 commands signal switch 10 to pass the RF signal from its input 18a to its output 18b. In other words, when processing system 16 is not active, processing system 16 does not process the RF signal, nor does it produce an output signal that is applied to output 18b. Instead, when processing system 16 is not active, control circuit 12 is configured for enabling signal switch 10 to be turned "on" and thereby allow the RF signal to pass through signal switch 10 from input 18a to output 18b. This is realized with a zero-voltage difference between the anode of diode 104 and the common conductor 107. In other words, control circuit 12 is configured for enabling a DC voltage at the anode of the diode 104 to be the same as a DC voltage at the common conductor 107, wherein the difference in voltage between the anode of the diode 104 and the common conductor 107 is zero volts. Furthermore, there is no DC voltage difference between the anode and cathode of the diode 104, nor between the control electrode (gate G of the transistor) and the main current channel of the transistors 100, 102. Recall that transistors 100 and 102 are "normally-on" transistors, which means that each transistor is conductive when no voltage difference is present between the transistor's gate (G) and source (S). With respect to no DC voltacie difference between the anode and cathode of the diode 104, diode 104 is not forward-biased and therefore has a high dynamic resistance. As indicated above, the control circuit 12 enables a voltage at the anode of the diode 104 to be the same as a voltage at the common conductor 107, and so, during the switch "on" state, no DC voltage difference is present between the anode and cathode. At the same time, the main current channels of the transistors 100, 102 are conductive. Thus, an "on" state (also referred to herein as "on-state") of the signal switch 10 is realized, wherein signal switch 10 provides a signal passage with low attenuation between the input 18a and the output 18b. As understood from the discussion above, it should be noted that this "on" state of the signal switch 10 does not require any voltage difference (other than a zero-voltage difference as provided in response to the outputs of the control circuit 12 in connection with the diode 104 and the common conductor 107) to be applied to the signal switch 10 for the signal switch 10 to be in the on-state. Accordingly, the on-state can be realized without a need for a voltage difference that can be provided from an additional supply voltage source. In another embodiment, the on-state of signal switch 10 may also be realized in response to a supply voltage difference, wherein the supply voltage difference comprises an effective zero-voltage difference between the anode of diode 104 and common conductor 107 (wherein, for this embodiment, the effective zero-voltage difference corresponds to a voltage difference that is smaller than the voltage needed for forward-biasing diode 104), further in responsive to a command from processing system 16, when signal switch 10 is needed to pass an input RF signal from the input 18a to the output 18b.

Resistor 106 is primarily used to determine the current through diode 104 when this diode 104 is forward-biased. This current is preferably made sufficiently high to ensure a sufficiently low dynamic resistance of diode 104 in the off-state of switch 10. When only very small currents are needed, parasitic resistances may be used instead of resistance 106. In order to realize a minimum of attenuation in the on-state, a diode 104 with a small diode capacitance is preferably used, such as a PIN diode. Capacitors 108a,b serve to isolate the internal node 101 from the input and output 18a,b. Thus, control of the switch 10 is made independent of any DC voltages at the input 18a and output 18b. Of course capacitors 108a,b may be omitted when no DC voltage is applied to the input and output 18a,b, or when the applied DC voltage does not affect operation of the switch 10. Decoupling capacitor 105 need not be present explicitly, its function may be provided, for example, by the power supply of the circuit. However, for high-frequency signals, an explicit decoupling capacitor 105 is preferably used. As shown in FIG. 1, a common conductor 107 is used both for applying voltages to the control electrodes of transistors 100, 102 and as a common terminal for signal input and output, but of course these need not be directly connected. Instead, decoupling capacitor 105 may be coupled to the common terminal for signal input and output, and the control electrodes of the transistors and resistor 106 may be coupled to an internal common conductor 107.

Although the control electrodes of the transistors 100, 102 are shown connected directly to the common conductor 107, components may be added in this connection without affecting the principle of operation of the circuit, because no DC current flows through the connections. Similarly, a component such as a second diode or a small resistance may be added in series with diode 104 without affecting the principle of operation of the circuit, although this may decrease isolation in the "off" state. Likewise, components such as small resistors may be included in series with the main current channels of the transistors 100, 102 without affecting the principle of operation, although this will increase attenuation in the "on" state.

As an alternative, diode 104 and resistance 106 could be exchanged, so that diode 104 is arranged between internal node 101 and common conductor 107 with its anode connected to the internal node 101, and resistance 106 is coupled between the output of control circuit 12 that is not connected to the common conductor 107 and the internal node 101. In this arrangement, the voltage difference between the control electrodes of transistors 100, 102 and their main current channels is equal to the forward bias voltage of diode 104 in the off-state of the switch. This means that the threshold voltage of the transistors 100, 102 must be in the narrow range between zero and this forward bias voltage. A low threshold voltage is needed in this alternative, resulting in a higher resistance and higher losses. Also, the value of the threshold voltage is much more critical in this alternative.

The invention claimed is:

1. An electronic signal processing apparatus with a signal switch, the switch comprising:
   a switch input, a switch output and an internal node;
   a first and a second depletion transistor, having main current channels coupled between the internal node and the switch input and output, respectively;
   a signal processing arrangement between the internal node and a common reference conductor of the switch input and switch output, the signal processing arrangement comprising:
   a diode; and
   a switch control circuit having a first control output and a second control output, wherein the first control output is coupled to the common reference conductor and wherein the second control output is coupled to the main current channels of the first and the second depletion transistor via the internal node, further via the diode in a forward direction, so as to control conduction of the main current channels,
   wherein the first and second depletion transistor further having control electrodes coupled to the common reference conductor,
   wherein the switch has a T-type attenuator structure having a leg and at least one branch, the diode being disposed in the leg of the T-type attenuator structure and at least one transistor being disposed in the branch of the T-type attenuator structure, the T-type structure enabling the switch to remain in an "on" state even in the absence of an "off" state control voltage at the internal node, and
   wherein the internal node applies a control voltage, in response to a signal on the second control output of the switch control circuit that is configured for forward-baising the diode, that switches the switch via the at least one transistor to an "off" state.

2. An electronic signal processing apparatus as claimed in claim 1, wherein the diode is part of a current path from the second control output to the internal node, wherein response to the second control output enabling the current path, the diode is forward-biased and a control voltage that makes the main current channels non-conductive is applied from the second control output to the main current channels via the diode.

3. An electronic signal switch, the switch comprising
   a switch input, a switch output and an internal node;
   a first and a second depletion transistor, having main current channels coupled between the internal node and the switch input and switch output, respectively;
   a signal connection between the internal node and a common reference conductor of the switch input and output, the signal connection comprising:
   a diode; and
   a control input, coupled to the main current channel of the first and the second depletion transistor via the internal node, further via the diode in a forward direction, to control conduction of the main current channels,
   wherein the first and second depletion transistor further having control electrodes coupled to the common reference conductor,
   wherein the switch has a T-type attenuator structure having a leg and at least one branch, the diode being disposed in the leg of the T-type attenuator structure and at least one transistor being disposed in the branch of the T-type attenuator structure, the T-type structure enabling the switch to remain in an "on" state even in the absence of an "off" state voltage at the internal node, and
   wherein the internal node applies a control voltage, in response to a signal at the control input that is configured for forward-biasing the diode, that switches the switch via the at least one transistor to an "off" state.

4. An electronic signal switch as claimed in claim 3, wherein the diode is part of a current path from the control input to the internal node, wherein responsive to the control input enabling the current path, the diode is forward-biased and a control voltage that makes the main current channels non-conductive is applied from the control input to the main current channels via the diode.

* * * * *